United States Patent
Kopp et al.

(12) 
(10) Patent No.: US 6,411,635 B1
(45) Date of Patent: Jun. 25, 2002

(54) APPARATUS AND METHOD FOR MODE SELECTION IN A PHOTONIC BAND EDGE LASER

(75) Inventors: Victor Il'ich Kopp, Flushing; Azriel Zelig Genack, New York, both of NY (US)

(73) Assignee: Chiral Photonics, Inc., Clifton, NJ (US)

( * ) Notice: Subject to any disclaimer, the term of this patent is extended or adjusted under 35 U.S.C. 154(b) by 0 days.

(21) Appl. No.: 09/539,823

(22) Filed: Mar. 31, 2000

Related U.S. Application Data (60) Provisional application No. 60/127,238, filed on Mar. 31, 1999.

(51) Int. Cl.$^7$ ................................................. H01S 3/14
(52) U.S. Cl. ............................ 372/39; 392/69; 392/20
(58) Field of Search ............................ 372/39, 20, 69, 372/70

(56) References Cited

U.S. PATENT DOCUMENTS

2001/0036212 A1 * 11/2001 Kopp et al. .................. 372/43

* cited by examiner

Primary Examiner—Leon Scott, Jr.
(74) Attorney, Agent, or Firm—Edward Etkin, Esq

(57) ABSTRACT

The present invention advantageously enables single-mode lasing at higher pump power and further enables general reduction of the lasing radiation bandwidth. This is accomplished by producing an appropriate spatial gain distribution inside the laser medium. The present invention further enables advantageous selection of a particular photonic mode for lasing at that mode in a periodic laser by varying spatial gain distribution within the periodic laser medium. Photonic mode selection by varying gain distribution within the laser medium is accomplished in accordance with various embodiments of the present invention.

53 Claims, 5 Drawing Sheets

APPARATUS AND METHOD FOR MODE SELECTION IN A PHOTONIC BAND EDGE LASER

RELATED APPLICATIONS

This application claims priority from U.S. Provisional Patent Application Ser. No. 60/127,238 entitled "Method of Mode Selection in a Photonic Band Edge laser" which was filed on Mar. 31, 1999.

FIELD OF THE INVENTION

The present invention relates generally to lasers based on periodic structures having photonic band gaps, and more particularly to lasers having selectable lasing modes.

BACKGROUND OF THE INVENTION

Semiconductor lasers have found many industrial and commercial applications in recent years. For example, lasers are used in telecommunications, in optically readable media pickups that are used in CD players, CD ROM drives and DVD players, and in medical imaging. However, previously known semiconductor lasers have a number of disadvantages. For example, traditional semiconductor lasers, such as ones used in CD players, emit light from the edge of a chip, so it is necessary to cleave a wafer into chips and package the chip before knowing if the laser functions properly. Other types of light sources, such as LEDs do not provide the performance needed for certain applications.

Vertical Cavity Surface Emitted Lasers (hereinafter "VCSELs") have been developed to address the need for a more advanced, higher quality laser that can function well in a variety of applications. VCSELs combine the performance advantages of LEDs and of edge-emitting lasers at costs comparable to LED solutions. VCSELs emit light vertically from the wafer surface, like LEDs, which means their fabrication and testing is fully compatible with standard I.C.s procedures and equipment, and also means that arrays of VCSELs are feasible. Additionally, VCSELs are much faster, more efficient, and produce a smaller divergence beam than LEDs.

The VCSEL structure leads to a host of performance advantages over conventional semiconductor lasers.

1) small size
2) low power consumption
3) 2-dimensional array capabilities

In contrast to conventional edge-emitting semiconductor lasers, the surface-emitting VCSEL has a symmetric Gaussian near-field, greatly simplifying coupling to optical elements or fibers. In addition, VCSEL technology allows the fabrication of two-dimensional laser arrays.

However, VCSELs suffer from a number of disadvantages. The manufacture of VCSELs requires sophisticated and expensive microfabrication. Since single-pass gain in thin layer semiconductor lasers is low, VCSELs incorporate highly reflective dielectric stacks which are integrated into the laser as Bragg reflectors. These consist of alternating layers of dielectric material, which are grown using methods of molecular beam epitaxy (MBE). This ensures a close match of the atomic lattice structures of adjacent layers. Alternating atomically ordered layers of materials with different electronic characteristics are thereby produced. The interfaces between the layers must be digitally graded and doped to reduce the electrical resistance.

Much work has been done to improve the performance of VCSELs by increasing the number of layers and/or the dielectric difference between alternating layers. However, this approach makes the fabrication more expensive and difficult. There is also a limit to the number of layers determined by the absorption in these layers. While VCSELs can be manufactured in two-dimensional arrays, there has been great difficulty in achieving uniform structure over large areas and in producing large area arrays. The materials typically used for VCSELs do not have the desired low absorption and high index contrast over a broad frequency range. In particular, it is difficult to achieve high reflectivity in the communication band around 1.5 microns.

In addition, VCSELs cannot be tuned in frequency since their periods cannot be changed. The density of photon modes is not changed appreciably by use of low index contrast multilayer Bragg reflector and the gain cannot be improved in a VCSEL system as compared to that in an ordinary laser cavity. Also, an external device must be used to control the polarization of the light.

In recent years, periodic materials, for example chiral materials such as cholesteric liquid crystals (CLCs), have been used in a variety of lasing, filtering and other similar applications to address common drawbacks of standard semiconductor devices such as VCSELs. Photonic band edge lasing has recently been demonstrated in dye-doped cholesteric materials with emission being in a narrow range of frequencies near the edge of the photonic band gap and with the same periodicity as the CLC structure. At the lowest excitation power provided by an external excitation source (such as an optical pump), lasing was produced at the photonic mode closest to the edge of the photonic band gap for radiation propagating perpendicular to the molecular planes of the chiral material with the same sign of rotation as a molecular director of the CLC structure. As the pump power was increased, however, to the point where the efficiency of the laser was high, the laser bandwidth broadened while emission spectra appeared to be a set of individual peaks resulting in loss of efficiency. Other periodic lasers experience similar difficulties. Furthermore, selection of lasing wavelength in previously known periodic lasers is often a difficult task.

It would thus be desirable to provide an apparatus and method for advantageously enabling single-mode lasing at higher pump power, for generally reducing the bandwidth of the lasing radiation, and for enabling advantageous selection of a particular photonic mode for lasing at that mode in a periodic laser. It would also be desirable to provide a laser apparatus and method that has advantageous properties similar but superior to VCSELs and that has none of the VCSELs' disadvantages

SUMMARY OF THE INVENTION

The present invention advantageously enables single-mode lasing at higher pump power and further enables general reduction of the lasing radiation bandwidth. This is accomplished by producing an appropriate spatial gain distribution inside the laser medium. The present invention further enables advantageous selection of a particular photonic mode for lasing at that mode in a periodic laser by varying spatial gain distribution within the periodic laser medium.

Photonic mode selection by varying gain distribution within the laser medium is accomplished in accordance with various embodiments of the present invention. In a first embodiment of the present invention, a periodic structure having a photonic band edge and being doped with a uniformly distributed gain medium, is optically pumped at a wavelength and polarization of a selected high photonic mode at or near the high-frequency band edge to produce lasing at a frequency of a corresponding low photonic mode of the same order at or near the low-frequency band edge.

In a second embodiment of the present invention, a periodic structure having a photonic band edge and being doped with a uniformly distributed gain medium, is optically pumped by a gaussian light beam that is focused by a lens in the middle of the periodic structure. This arrangement produces a maximum excitation density in the middle of the periodic structure and favors lasing in the first photonic mode from either the high or low frequency band edge. The particular edge favored in lasing is selected by varying the relative strength of the pumping beam and the gain spectral distribution of the gain medium.

In a third embodiment of the present invention, a periodic structure is doped with gain medium disposed within the structure in a non-uniform manner, thereby producing a spatially modulated gain medium. The number of high density gain medium areas in the periodic structure as well as the gain spectral distribution determine the number, and thus the wavelength, of the photonic mode at which lasing occurs.

In a fourth embodiment of the present invention, a periodic structure having a photonic band edge and being doped with a uniformly distributed gain medium, is electrically excited by a spatially non-uniform electrical current resulting in a modulated gain within the periodic structure. The peak gain distribution as well as the gain spectral distribution within the structure determine the number, and thus the wavelength, of the photonic mode at which lasing occurs.

In a fifth embodiment of the present invention, a periodic structure having a photonic band edge and being doped with a uniformly distributed gain medium is arranged as a vertical cavity liquid crystal laser (VCLCL). The VCLCL is optically pumped by a plurality of light emitting diodes (LED) surrounding VCLCL in a spatially non-uniform manner to produce one or more high gain peak areas within the periodic structure. The number of high gain peaks in the periodic structure as well as the gain spectral distribution determine the number, and thus the wavelength, of the photonic mode at which lasing occurs.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote elements throughout the several views.

DETAILED DESCRIPTION OF PREFERRED EMBODIMENTS

The present invention is described with reference to chiral materials such as cholesteric liquid crystal materials by way of example only—it should be understood that the apparatus and method of present invention may be utilized with any periodic material having properties similar to cholesteric liquid crystals, for example, a layered dielectric structure, without departing from the spirit of the invention. Furthermore, a variety of active or light-emitting materials are described in connection with the present invention. It should be understood that unless otherwise specified, any electrically or optically excitable material that emits photons may be used as a matter of design choice without departing from the spirit of the invention.

Before describing the present invention in greater detail, it would be helpful to provide definitions of common terms utilized in the dielectric lasing art. "Chiral" materials are not symmetrical on a molecular level—that is molecules of chiral materials are not identical to their mirror images. Cholesteric materials, such as cholesteric liquid crystals (hereinafter "CLCs"), have multiple molecular layers where molecules in the different layers are oriented on average at a slight angle relative to molecules in other layers. Molecules in consecutive layers are rotated slightly relative to those in the preceding layer. Thus, the average direction of the molecules, known as a "director", rotates helically throughout the cholesteric material. For the purposes of the describing the present invention, the angle between directors of consecutive layers shall be referred to as a "shift angle". A pitch of a cholesteric material is defined as a thickness of the material in which the director rotates a full 360 degrees. Cholesteric structures also have a property called "handedness"—they may be right-handed or left-handed depending on the direction of rotation of the molecules from layer to layer. The handedness of a cholesteric structure determines the circular polarization and amplitude of light passing through the structure.

Figure 6:
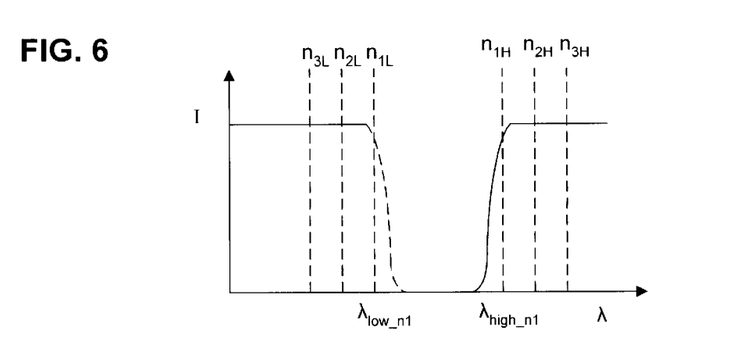
FIG. 6 is a graph diagram showing various photonic modes at low and high wavelength edges of the photonic band gap of the periodic medium of FIGS. 1–5.

CLCs have a particular reflection band (hereafter referred to as a "photonic stop band") which is a result of its periodic structure—a range of wavelengths where there is no transmission of light through the structure due to reflection. At the edge of the photonic stop band gap there are a series of narrow photonic states (or modes) at the peak of which transmission of light reaches unity. The spectral width of these states is proportional to the inverse of the dwell time for the photons within the CLC medium. The long dwell time of photons in spectrally narrow states facilitates lasing at the frequency of these modes in activated materials since emitted photons are given greater opportunity to stimulate emission before they emerge from the CLC medium. Since the photon lifetime is longest for the state closest to the photonic stop band edge and falls rapidly with state number from the edge, lasing occurs in the wavelength corresponding to the first state or corresponding to a few states closest to the photonic stop band edge. This is taught by the commonly-assigned "Stop Band Laser" patent application of A. Z. Genack et al. (Ser. No. 09/302,630, filed Apr. 30, 1999) which discloses that in a generally homogeneous CLC structure lasing advantageously occurs at the edges of the photonic stop band due to the higher density of photohic states and correspondingly longer dwell time therein. Referring to FIG. 6, a photonic band gap diagram illustrating photonic modes at the low wavelength band edge and at the corresponding high wavelength band edge is shown.

Photonic band edge lasing has recently been demonstrated in dye-doped cholesteric materials with emission being in a narrow range of frequencies near the edge of the photonic band gap and with the same chirality as the CLC structure. At the lowest excitation power provided by an external excitation source (such as an optical pump), lasing was produced at the photonic mode closest to the edge of the photonic band gap for radiation propagating perpendicular to the molecular planes of the chiral material with the same sign of rotation as a molecular director of the CLC structure. As the pump power was increased, however, to the point where the efficiency of the laser was high, the laser bandwidth broadened while emission spectra appeared to be a set of individual peaks resulting in loss of efficiency.

The broadening of the laser bandwidth at higher excitation power is related to the character of the spatial distribution of the pumping and emitted laser radiation within the chiral laser. Computer simulations have shown that the intensity within the CLC material for modes near the band edge varies as the square of a sinusoidal function. As the frequency separation from the band edge on the low and high frequency side of the band increases, the number of peaks in the intensity within the medium increases from one to n for the $n^{th}$ mode from either the low or high frequency band edge. This is demonstrated in FIGS. 8A and 8B.

Because the optical frequency of the pump beam exciting the CLC laser was well above the reflection band and the pump beam was only slightly focused in previously conducted research, the gain distribution was substantially uniform inside the CLC structure. The first mode was favored at low powers because of the longer photon dwell time for this mode relative to other modes. However above a certain pump power, higher order modes were favored. These modes exhibit intensity peaks closer to the front of the sample, where the high gain level has not been depleted by emission into the first mode, for which stimulated emission is peaked in the middle of the sample and relatively weak near the surfaces of the sample.

The present invention advantageously enables single-mode lasing at higher pump power and enables general reduction of the lasing radiation bandwidth. This is accomplished by producing an appropriate spatial gain distribution inside the laser medium. The present invention further enables advantageous selection of a particular photonic mode for lasing at that mode in a chiral laser by varying spatial gain distribution within the chiral laser medium.

Figure 1:
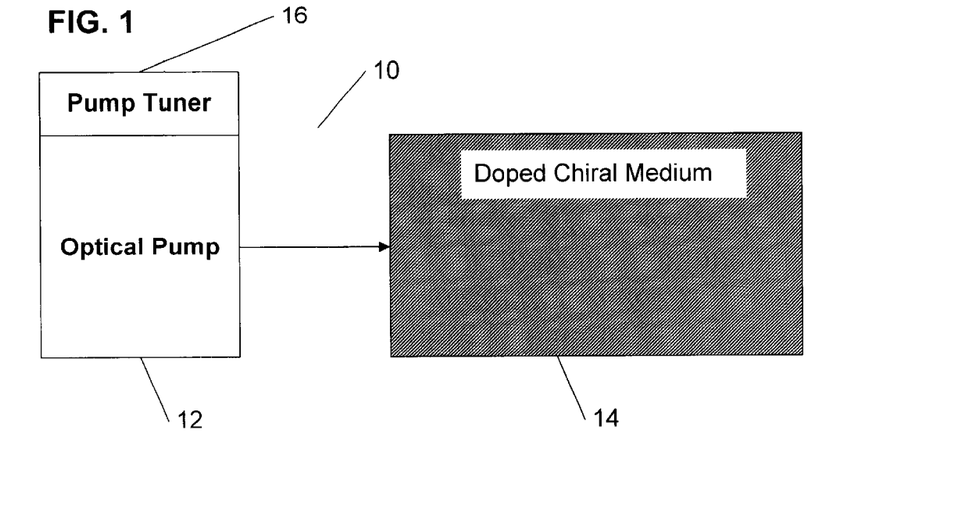
FIG. 1 is a schematic diagram of a first embodiment of a periodic laser of the present invention, in which the periodic laser is composed of a periodic medium uniformly doped with a gain medium, and wherein the periodic laser is optically pumped.

Referring initially to FIG. 1, a first embodiment of an inventive periodic laser 10 is shown. A periodic structure 14 having a photonic band gap is doped with a uniformly distributed gain medium. The gain medium may include, but is not limited to: laser dyes, rare earth elements, conjugated polymers or any medium in which electron-hole recombination occurs in the active material. Preferably, the gain spectral distribution of the gain medium is such that lasing is enabled at a low frequency band edge. As noted above, the periodic structure 14 may be composed from any periodic or chiral substance capable of transmitting light, such as cholesteric liquid crystal. An optical pump 12, such as a laser, a lamp or a light-emitting diode, provides a pumping light beam at a wavelength and polarization of a selected high frequency photonic mode at or near the high-frequency (i.e. low wavelength) band edge to produce lasing at a frequency of a corresponding low frequency photonic mode of the same order at or near the low-frequency (i.e. high wavelength) band edge. For example, referring to FIG. 6, if the optical pump 12 provided a pumping beam at a wavelength corresponding to the $n_{1L}$ mode, lasing would occur at a wavelength corresponding to the $n_{1H}$ mode.

An optional pump tuner 16 may be connected to the optical pump 12 to selectively control the pump beam frequency emitted to the periodic structure 14 and thus to selectively and advantageously control the photonic mode at which lasing occurs.

Figure 7A:
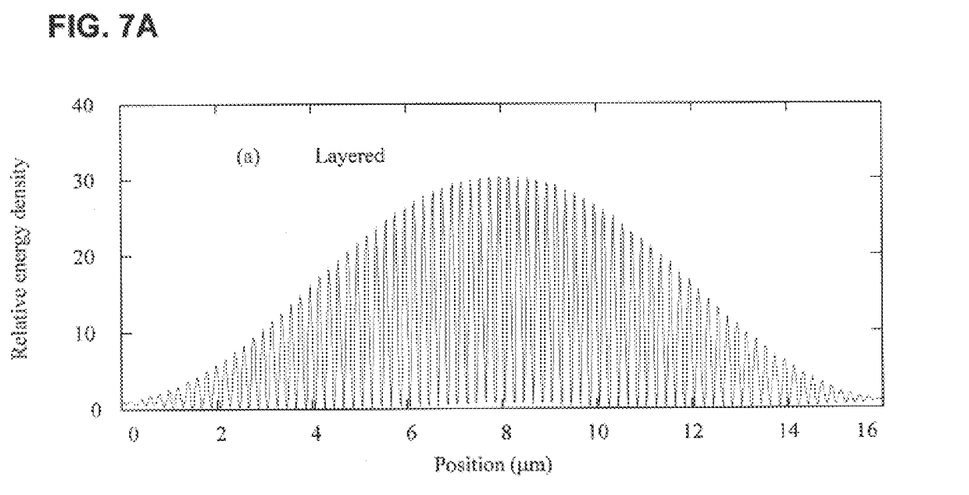
FIG. 7A is a graph diagram of distribution of energy density of the electromagnetic field inside a layered sample in connection with a computer simulated experiment where pumping occurs at a first photonic mode in accordance with the present invention.
Figure 7B:
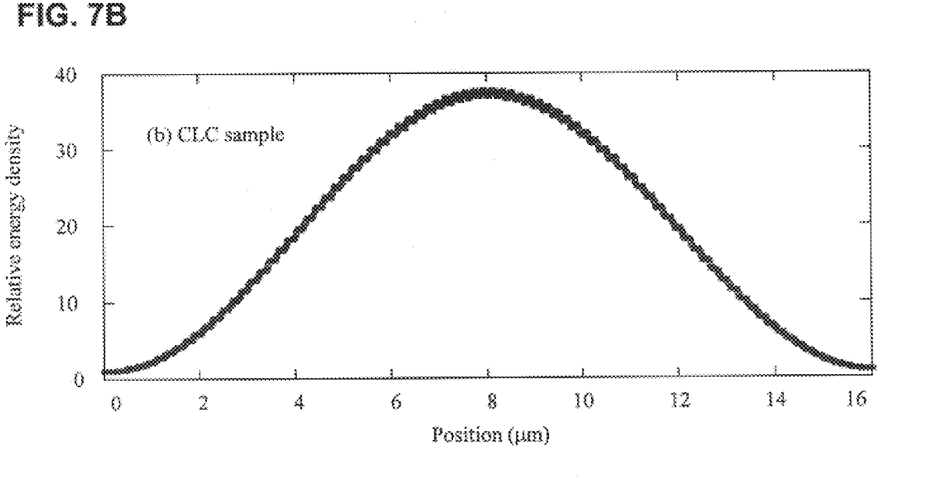
FIG. 7B is a graph diagram of distribution of energy density of the electromagnetic field inside a cholesteric liquid crystal sample in connection with a computer simulated experiment where pumping occurs at a first photonic mode in accordance with the present invention.

This result is further demonstrated in computer simulated experimental results shown in FIGS. 7A and 7B. FIG. 7A shows a distribution of the energy density of the electromagnetic field inside a 1-D periodic layered structure 14 at the wavelength of the $n_{1L}$ mode. The refractive indices are 1.47 and 1.63 for the layers of the layered dielectric structure The periodic structure 14 thickness is 16 $\mu$m and the period is 0.2 $\mu$m. Because pumping occurs at a first mode $n_{1L}$ of the high-frequency edge of the band, the gain is peaked in the middle of the layered periodic structure 14, favoring lasing at the frequency of the first mode $n_{1H}$ at the low-frequency edge of the band. Similarly, FIG. 7B shows a distribution of the energy density of the electromagnetic field inside a 1-D CLC structure 14 at the wavelength of the $n_{1L}$ mode. The ordinary and extraordinary indices of the CLC are 1.47 and 1.63. The periodic structure 14 thickness is 16 $\mu$m and the period is 0.2 $\mu$m. Because pumping occurs at a first mode $n_{1L}$ of the, the gain is peaked in the middle of the periodic structure 14, favoring lasing at the frequency of the first mode $n_{1H}$ at the low-frequency edge of the band.

Figure 8A:
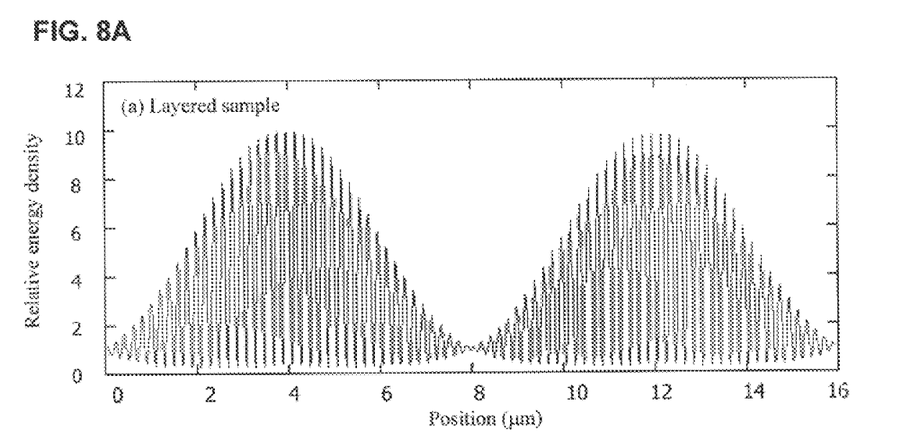
FIGS. 8A and 8B are graph diagrams of distribution of energy density of the electromagnetic field inside a layered sample in connection with a computer simulated experiment where pumping occurs at a second photonic mode in accordance with the present invention.
Figure 8B:
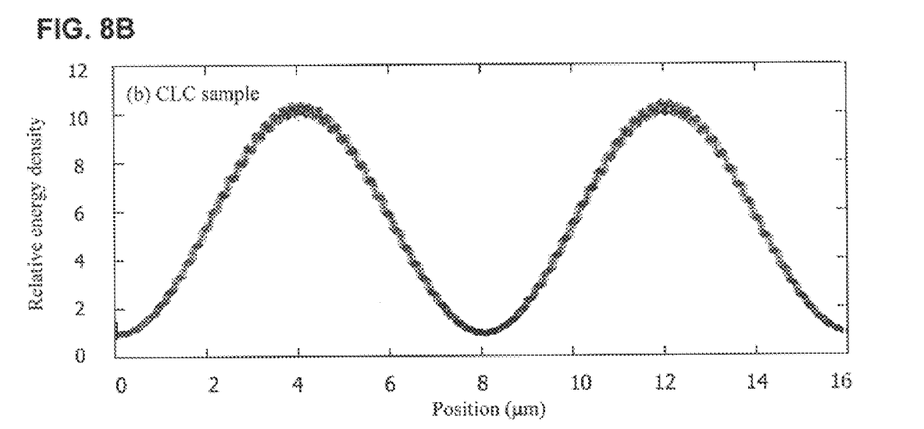

In another experimental example demonstrated in FIGS. 8A and 8B, optical pumping is applied to the periodic structure 14 having the same characteristics and properties as the structure in FIGS. 7A and 7B, at a second mode $n_{2L}$ of the high frequency edge of the band to produce two gain peaks within the periodic structure 14. This arrangement favors lasing at the frequency of the second mode $n_{2H}$ at the low-frequency edge of the band.

Figure 2:
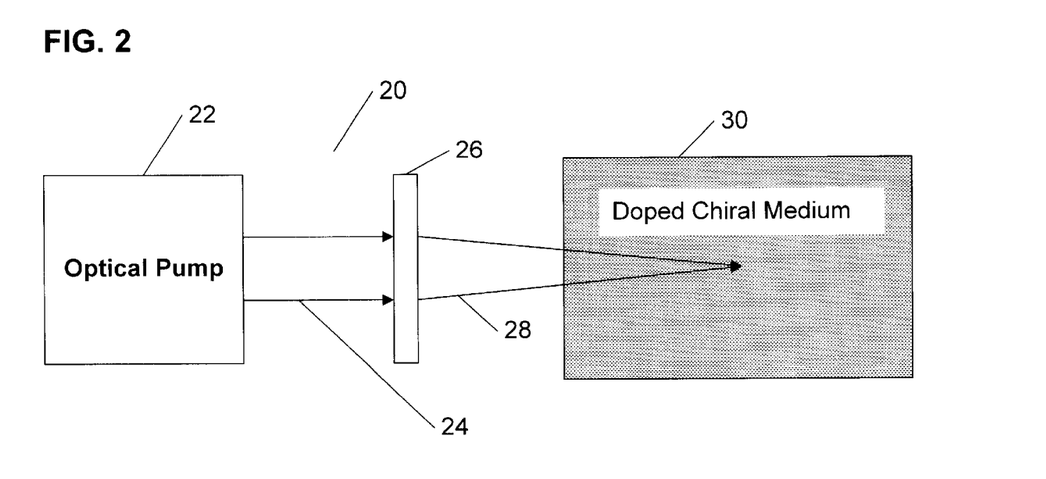
FIG. 2 is a schematic diagram of a second embodiment of a periodic laser of the present invention, in which the periodic laser is composed of a periodic medium uniformly doped with a gain medium and in which an optical pump beam is focused at the center of the periodic medium to produce peak gain therein.

Referring to FIG. 2, a second embodiment of an inventive periodic laser 20 is shown. A periodic structure 30 having a photonic band gap is doped with a uniformly distributed gain medium. The gain medium may include, but is not limited to: laser dyes, rare earth elements, conjugated polymers or any medium in which electron-hole recombination occurs in the active material. As noted above, the periodic structure 30 may be composed from any or chiral substance capable of transmitting light, such as cholesteric liquid crystal. An optical pump 22, such as a laser, a lamp or a light-emitting diode, provides a pumping gaussian light beam 24 at a predetermined wavelength and polarization that is focused by a focusing lens 26 into a beam 28 having the highest focus and intensity substantially in the middle portion of the periodic structure 30. This arrangement produces a maximum excitation and thus gain density in the middle of the periodic structure and favors lasing in the first photonic mode from either the high or low frequency band edge (i.e. at wavelengths corresponding to photonic modes $n_{1L}$ or $n_{1H}$). The particular edge, and thus the mode, favored in lasing is selected as a matter of design choice by varying the relative strength of the pumping beam and/or by selecting a gain medium having a particular desired gain spectral distribution.

Figure 3A:
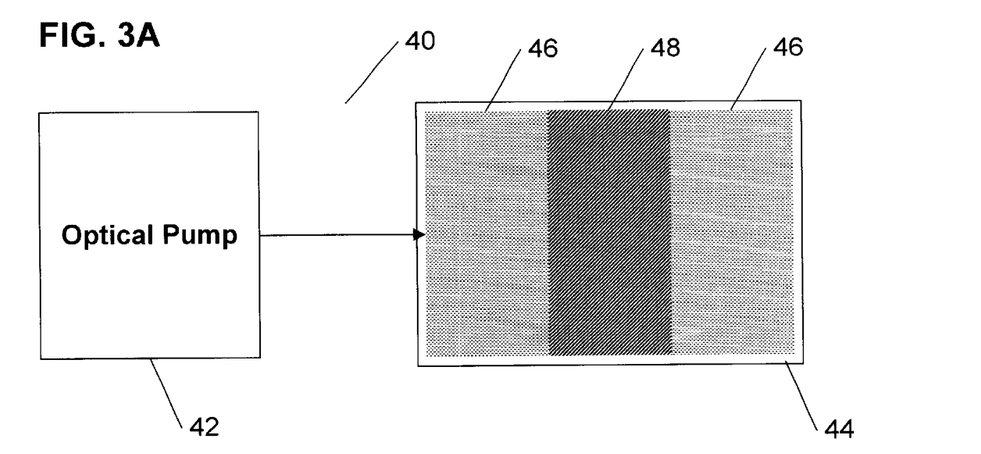
FIGS. 3A and 3B are schematic diagrams of a third embodiment of a periodic laser of the present invention, in which the periodic laser is composed of a periodic medium doped with a gain medium distributed within said periodic structure in a plurality of equally spaced alternating regions of high and low gain medium concentration, and wherein the periodic laser is optically pumped.
Figure 3B:
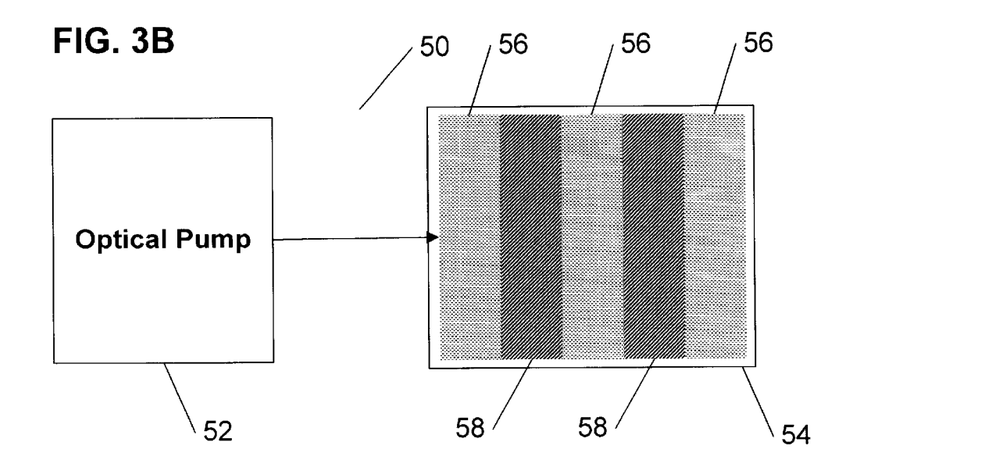

Referring to FIG. 3A, a third embodiment of an inventive periodic laser 40 is shown. A periodic structure 44 having a photonic band gap is doped with a gain medium distributed in a non-uniform but symmetrical manner. The gain medium may include, but is not limited to: laser dyes, rare earth elements, conjugated polymers or any medium in which electron-hole recombination occurs in the active material. The non-uniform gain medium distribution may be accomplished in a number of ways. For example, the periodic material may be composed of bands having alternating high and low gain medium concentrations. An exemplary arrangement with two low gain density regions 46, and a high gain density region 48 is shown in FIG. 3A; another exemplary arrangement with three low gain density regions 56, and two high gain density regions 58 is shown in FIG. 3B. It should be noted that other non-uniform gain distribution configurations of the periodic structures 44, 54 may be used as a matter of design choice without departing from the spirit of the present invention.

As noted above, the periodic structure 30 may be composed from any or chiral substance capable of transmitting light, such as cholesteric liquid crystal. An optical pump 42, such as a laser, a lamp or a light-emitting diode, provides a pumping beam to the periodic structure 44. When the periodic structure 44 is pumped, gain is peaked at the position of the high gain density region 48 and thus results in lasing at a first mode of either the high frequency band edge or the low frequency band edge. The particular edge, and thus the mode, favored in lasing is selected as a matter of design choice by selecting a gain medium having a particular desired gain spectral distribution.

Referring to FIG. 3B and alternate third embodiment of a periodic laser 50 is shown. In this arrangement there are two high density gain regions 58 in the periodic structure 54, and thus two gain peaks within the structure. When the periodic structure 54 is pumped by a optical pump 52, gain is peaked at the positions of the high gain density regions 58 and thus results in lasing at a second mode of either the high frequency band edge or the low frequency band edge. The particular edge, and thus the mode, favored in lasing is selected as a matter of design choice by selecting a gain medium having a particular desired gain spectral distribution. Thus the number of the photonic mode at which lasing occurs may be advantageously selected by determining a number of high gain density regions alternating with low density gain regions within a periodic structure.

Figure 4:
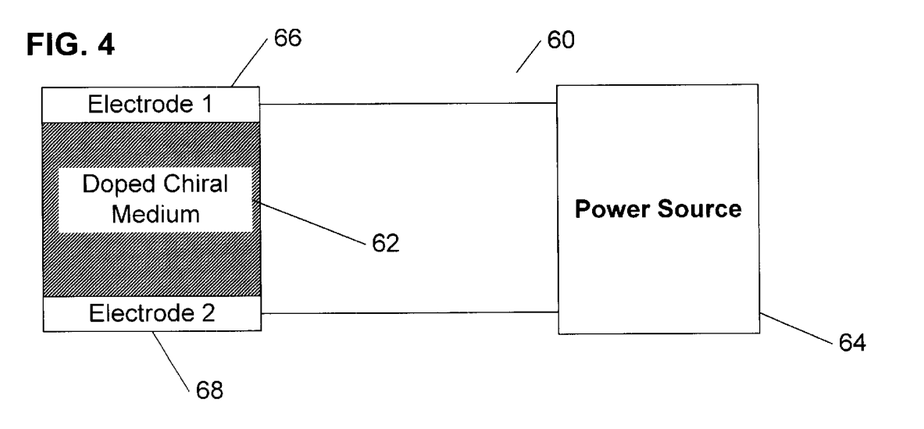
FIG. 4 is a schematic diagram of a fourth embodiment of a periodic laser of the present invention, in which the periodic laser is composed of a periodic medium uniformly doped with a gain medium, and wherein the periodic laser is electrically pumped with a non-uniform current.

Referring to FIG. 4, a fourth embodiment of an inventive periodic laser 60 is shown. A periodic structure 62 having a photonic band gap is doped with a uniformly distributed electrically excitable gain medium. The periodic structure 62 is preferably conductive. The electrodes 66 and 68 are preferably positioned on opposing sides of the periodic structure 62 The electrodes 66, 68 are connected to a power source 64. The power source 64 may be any electrical current source capable of providing charge current between electrodes connected thereto. Similarly to the third embodiment of the present invention, the periodic structure 62 may be configured to produce different numbers of gain peaks therein to achieve lasing at different modes. The determination of the number of gain peaks within the periodic structure 62 may be accomplished in at least two approaches by providing a spatially non-uniform current through the periodic structure 62. Utilizing the first inventive approach, the electrodes 66, 68 are preferably configured to provide non-uniform therebetween through the periodic structure 62 to produce alternating high and low current regions. Utilizing the second inventive approach, the periodic structure 62 may be configured to contain regions of alternating high and low conductivity, such that when current is passed between electrodes 66 and 68, a number of produce alternating high and low current regions is produced. Gain peaks corresponding to the number of high current regions within the periodic structure 62 determine the number of the photonic mode at which lasing occurs. The particular edge, and thus the mode, favored in lasing is selected as a matter of design choice by selecting a gain medium having a particular desired gain spectral distribution.

Figure 5:
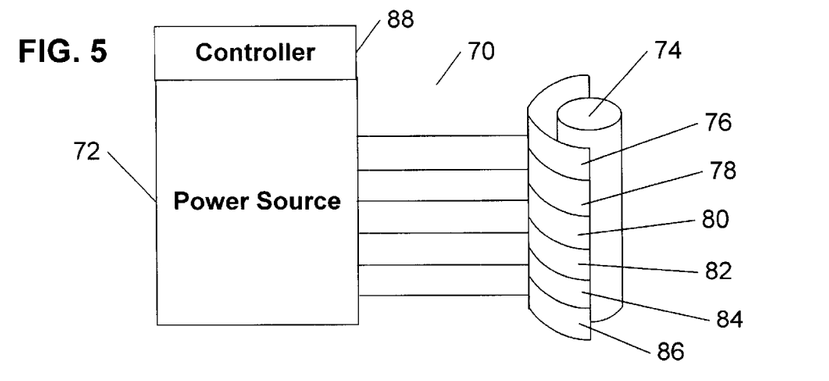
FIG. 5 is a schematic diagram of a fifth embodiment of a periodic laser of the present invention, in which the periodic laser is composed of a periodic medium uniformly doped with a gain medium arranged as a vertical cavity liquid crystal laser, and wherein the periodic laser is optically pumped in a nonuniform manner.

Referring to FIG. 5, a fifth embodiment of an inventive periodic laser 70 is shown. A periodic structure 74 having a photonic band gap is doped with a uniformly distributed gain medium and arranged in a form of a vertical cavity liquid crystal laser (VCLCL). The gain medium may include, but is not limited to: laser dyes, rare earth elements, conjugated polymers or any medium in which electron-hole recombination occurs in the active material. As noted above, the periodic structure 70 may be composed from any or chiral substance capable of transmitting light, such as cholesteric liquid crystal. Several optical pumps 76 to 86, such as light-emitting diodes, are distributed along the periodic structure 70. The optical pumps 76 to 86 are connected to a power source 72. Similarly to the third embodiment of the present invention, one or more alternating high gain regions within the periodic structure may be advantageously produced by configuring the optical pumps 76 to 86 to provide different excitation beams to the periodic structure 72. While six optical pumps are shown in FIG. 5 by way of example, it should be understood that other quantities of optical pumps may be used as a matter of design choice without departing from the spirit of the invention.

This when the optical pumps 76 to 86 are configured to produce a single gain peak within the periodic structure 74, lasing occurs at the first photonic mode wavelength, while if three gain peaks are produced, lasing occurs at the third photonic mode wavelength. An optional controller 88 may be connected to the electrical power source 72 to selectively control the operation of the optical pumps 76 to 86 such that the particular lasing wavelength may be advantageously selected. The particular edge, and thus the mode, favored in lasing is selected as a matter of design choice by selecting a gain medium having a particular desired gain spectral distribution.

Thus, while there have shown and described and pointed out fundamental novel features of the invention as applied to preferred embodiments thereof, it will be understood that various omissions and substitutions and changes in the form and details of the devices and methods illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

We claim:

1. A laser apparatus comprising:
   a periodic structure configured to produce a photonic stop band having a high frequency band edge comprising a first plurality of high frequency photonic modes of sequentially increasing frequencies and a low frequency band edge comprising a corresponding second plurality of low frequency photonic modes of sequentially decreasing frequencies, said periodic structure being doped with a uniformly distributed gain medium; and
   excitation means, applied to said periodic structure at a first excitation frequency corresponding to a selected one of said plural high frequency photonic modes, for causing said gain medium to emit electromagnetic radiation at a corresponding low frequency mode of said second plurality of low frequency photonic modes, such that lasing at a lasing wavelength corresponding to said low frequency mode occurs in a direction perpendicular to said periodic structure.

2. The laser apparatus of claim 1, further comprising:
   a tuning device, connected to said excitation means, operable to selectively vary said first excitation frequency to select a desired lasing wavelength.

3. The laser apparatus of claim 1, wherein said excitation means causes a plurality of equally spaced gain intensity peaks within said periodic structure, the quantity of said plural gain intensity peaks corresponding to a sequential number of said selected one high frequency photonic mode of said plural high frequency photonic modes.

4. The laser apparatus of claim 1, wherein said excitation means is selected from a group consisting of: a laser, a flash lamp, focused sunlight, and a light-emitting diode.

5. The laser apparatus of claim 1, wherein said periodic structure is composed from at least one material selected from a group consisting of: layered dielectric structure, cholesteric liquid crystal, conjugated polymer chiral material, artificially created chiral structure, naturally occurring chiral structure, a chiral substance configured to conduct electrons, and a chiral substance configured to conduct holes.

6. The laser apparatus of claim 1, wherein said gain medium is composed from at least one material selected from a group consisting of rare earth doped material, chelated rare earth doped material, semiconductor materials, organic light-emitting materials, conjugated polymers, dye-doped material, and materials containing color centers.

7. A laser apparatus comprising:
   a periodic structure configured to produce a photonic stop band having a high frequency band edge comprising a high frequency first photonic mode and a low frequency band edge comprising a low frequency first photonic mode, said periodic structure being doped with a uniformly distributed gain medium;
   an optical excitation means, for producing a gaussian light beam directed at said periodic structure; and
   focusing means for focusing said light beam at a substantially central portion of said periodic structure to excite said gain medium causing peak gain at said substantially central portion of said periodic structure so that said gain medium emits electromagnetic radiation such that lasing at a lasing wavelength corresponding to one of said low frequency first photonic mode and said high frequency first photonic mode occurs in a direction perpendicular to said periodic structure.

8. The laser apparatus of claim 7, further comprising means for selecting one of said low frequency first photonic mode and said high frequency first photonic mode to selectively control said lasing wavelength by at least one of: varying emission strength of said light beam, varying absorption of said periodic material, and varying a gain spectral distribution of said gain medium.

9. The laser apparatus of claim 7, wherein said optical excitation means is selected from a group consisting of: a laser, a flash lamp, focused sunlight, and a light-emitting diode.

10. The laser apparatus of claim 7, wherein said periodic structure is composed from at least one material selected from a group consisting of: layered dielectric structure, cholesteric liquid crystal, conjugated polymer chiral material, artificially created chiral structure, naturally occurring chiral structure, a chiral substance configured to conduct electrons, and a chiral substance configured to conduct holes.

11. The laser apparatus of claim 7, wherein said gain medium is composed from at least one material selected from a group consisting of: rare earth doped material, chelated rate earth doped material, semiconductor materials, organic light-emitting materials, conjugated polymers, dye-doped material, and materials containing color centers.

12. A laser apparatus comprising:
    a periodic structure configured to produce a photonic stop band having a high frequency band edge comprising a first plurality of high frequency photonic modes of sequentially increasing frequencies and a low frequency band edge comprising a corresponding second plurality of low frequency photonic modes of sequentially decreasing frequencies, said periodic structure being doped with a gain medium distributed within said periodic structure in a plurality of equally spaced alternating regions of high and low gain medium concentration; and
    an excitation means, applied to said periodic structure, for causing said gain medium to emit electromagnetic radiation at a particular frequency mode, a number of said particular frequency mode corresponding to a number of high gain medium concentration regions within said periodic structure, such that lasing at a lasing wavelength corresponding to said particular frequency mode occurs in a direction perpendicular to said periodic structure.

13. The laser apparatus of claim 12, wherein when said gain medium is of a first composition having a first gain spectral distribution, said particular frequency mode is located at said high frequency band edge, and wherein when said gain medium is of a second composition having a second gain spectral distribution, said particular frequency mode is located at said low frequency band edge.

14. The laser apparatus of claim 12, wherein said excitation means is selected from a group consisting of: a laser, a flash lamp, focused sunlight, and a light-emitting diode.

15. The laser apparatus of claim 12, wherein said periodic structure is composed from at least one material selected from a group consisting of: layered dielectric structure, cholesteric liquid crystal, conjugated polymer chiral material, artificially created chiral structure, naturally occurring chiral structure, a chiral substance configured to conduct electrons, and a chiral substance configured to conduct holes.

16. The laser apparatus of claim 12, wherein said gain medium is composed from at least one material selected from a group consisting of: rare earth doped material, chelated rare earth doped material, semiconductor materials, organic light-emitting materials, conjugated polymers, dye-doped material, and materials containing color centers.

17. A laser apparatus comprising:
a conductive periodic structure configured to produce a photonic stop band having a high frequency band edge comprising a first plurality of high frequency photonic modes of sequentially increasing frequencies and a low frequency band edge comprising a corresponding second plurality of low frequency photonic modes of sequentially decreasing frequencies, said periodic structure being doped with a uniformly distributed electrically excitable gain medium; and
a excitation means for applying a spatially non-uniform electrical current to said periodic structure to produce a plurality of alternating high gain and low gain regions within said periodic structure and to cause, said gain medium to emit electromagnetic radiation at a particular frequency mode, a number of said particular frequency mode corresponding to a number of high gain regions within said periodic structure, such that lasing at a lasing wavelength corresponding to said particular frequency mode occurs in a direction perpendicular to said periodic structure.

18. The laser apparatus of claim 17, wherein said excitation means further comprises a first and a second electrode, each electrode being in contact with respective opposing sides of said periodic structure and connected to a current source.

19. The laser apparatus of claim 18, wherein said excitation means is configured for applying said spatially non-uniform electrical current by configuring at least one of said first and second electrodes to produce said spatially non-uniform electrical current within said periodic structure.

20. The laser apparatus of claim 18, wherein said excitation means is configured for applying said spatially non-uniform electrical current by configuring said periodic structure to comprise a plurality of regions of alternating high and low conductivity, such that when a uniform current is passed between said first and said second electrodes, at least one high gain region corresponding to at least one high conductivity region within said periodic structure.

21. The laser apparatus of claim 17, wherein when said gain medium is of a first composition having a first gain spectral distribution, said particular frequency mode is located at said high frequency band edge, and wherein when said gain medium is of a second composition having a second gain spectral distribution, said particular frequency mode is located at said low frequency band edge.

22. The laser apparatus of claim 17, wherein said periodic structure is composed from at least one material selected from a group consisting of: conductive cholesteric liquid crystal, conductive conjugated polymer chiral material, artificially created conductive chiral structure, naturally occurring chiral structure, a chiral substance configured to conduct electrons, and a chiral substance configured to conduct holes.

23. A laser apparatus comprising:
a periodic structure configured to produce a photonic stop band having a high frequency band edge comprising a first plurality of high frequency photonic modes of sequentially increasing frequencies and a low frequency band edge comprising a corresponding second plurality of low frequency photonic modes of sequentially decreasing frequencies, said periodic structure being doped with a uniformly distributed gain medium and being configured as a vertical cavity liquid crystal laser; and
a excitation means for applying a spatially and intensity non-uniform optical excitation to said periodic structure to produce a plurality of alternating high gain and low gain regions within said periodic structure and to cause said gain medium to emit electromagnetic radiation at a particular frequency mode, a number of said particular frequency mode corresponding to a number of high gain regions within said periodic structure, such that lasing at a lasing wavelength corresponding to said particular frequency mode occurs in a direction perpendicular to said periodic structure.

24. The laser apparatus of claim 23, wherein said excitation means further comprises a power source connected to a plurality of optical pumps positioned sequentially along said periodic structure, said plural optical pumps being configured to produce a plurality of alternating high gain and low gain regions within said periodic structure by providing pumping light beams of different characteristics.

25. The laser apparatus of claim 24, wherein said excitation means further comprises control means for controlling configuration of said plural optical pumps.

26. The laser apparatus of claim 24, wherein each said plural optical pump is a light-emitting diode.

27. The laser apparatus of claim 24, wherein when said gain medium is of a first composition having a first gain spectral distribution, said particular frequency mode is located at said high frequency band edge, and wherein when said gain medium is of a second composition having a second gain spectral distribution, said particular frequency mode is located at said low frequency band edge.

28. The laser apparatus of claim 24, wherein said periodic structure is composed from at least one material selected from a group consisting of: layered dielectric structure, cholesteric liquid crystal, conjugated polymer chiral material, artificially created chiral structure, naturally occurring chiral structure, a chiral substance configured to conduct electrons, and a chiral substance configured to conduct holes.

29. The laser apparatus of claim 24, wherein said gain medium is composed from at least one material selected from a group consisting of: rare earth doped material, chelated rare earth doped material, semiconductor materials, organic light-emitting materials, conjugated polymers, dye-doped material, and materials containing color centers.

30. A laser apparatus comprising:
a periodic structure configured to produce a photonic stop band having a high frequency band edge comprising a first plurality of high frequency photonic modes of sequentially increasing frequencies and a low frequency band edge comprising a corresponding second plurality of low frequency photonic modes of sequentially decreasing frequencies, said periodic structure being doped with a gain medium; and mode selection means for selecting a mode from one of said first plurality of high frequency photonic modes and second plurality of low frequency photonic modes, comprising:

means for varying gain distribution within said periodic structure to produce a non-uniform gain distribution having at least one gain peak therein, and excitation means, applied to said periodic structure, for causing said gain medium to emit electromagnetic radiation at a particular frequency mode, a number of said particular frequency mode corresponding to a number of gain peaks within said periodic structure, such that lasing at a lasing wavelength corresponding to said particular frequency mode occurs in a direction perpendicular to said periodic structure.

31. A method of lasing implemented in a periodic structure configured to produce a photonic stop band having a high frequency band edge comprising a first plurality of high frequency photonic modes of sequentially increasing frequencies and a low frequency band edge comprising a corresponding second plurality of low frequency photonic modes of sequentially decreasing frequencies, said periodic structure being doped with a uniformly distributed gain medium, the method comprising the step of:

(a) applying excitation to said periodic structure at a first excitation frequency corresponding to a selected one of said plural high frequency photonic modes, thereby causing said gain medium to emit electromagnetic radiation at a corresponding low frequency mode of said second plurality of low frequency photonic modes, such that lasing at a lasing wavelength corresponding to said low frequency mode occurs in a direction perpendicular to said periodic structure.

32. The method of lasing of claim 31, further comprising the step of:

(b) selectively varying said first excitation frequency to thereby select a desired lasing wavelength.

33. The method of lasing of claim 31, wherein said periodic structure is composed from at least one material selected from a group consisting of: layered dielectric structure, cholesteric liquid crystal, conjugated polymer chiral material, artificially created chiral structure, naturally occurring chiral structure, a chiral substance configured to conduct electrons, and a chiral substance configured to conduct holes.

34. The method of losing of claim 31, wherein said gain medium is composed from at least one material selected from a group consisting of: rare earth doped material, chelated rare earth doped material, semiconductor materials, organic light-emitting materials, conjugated polymers, dye-doped material, and materials containing color centers.

35. The method of lasing of claim 30, wherein said periodic structure is composed from at least one material selected from a group consisting of: layered dielectric structure, cholesteric liquid crystal, conjugated polymer chiral material, artificially created chiral structure, naturally occurring chiral structure, a chiral substance configured to conduct electrons, and a chiral substance configured to conduct holes.

36. The method of lasing of claim 31, wherein said gain medium is composed from at least one material selected from a group consisting of: rare earth doped material, chelated rare earth doped material, semiconductor materials, organic light-emitting materials, conjugated polymers, dye-doped material, and materials containing color centers.

37. A method of lasing implemented in a periodic structure configured to produce a photonic stop band having a high frequency band edge comprising a high frequency first photonic mode and a low frequency band edge comprising a low frequency first photonic mode, said periodic structure being doped with a uniformly distributed gain medium, comprising the steps of:

(a) producing a gaussian light beam directed at the periodic structure; and (b) focusing said light beam at a substantially central portion of said periodic structure to excite said gain medium causing peak gain at said substantially central portion of said periodic structure so that said gain medium emits electromagnetic radiation such that lasing at a lasing wavelength corresponding to one of said low frequency first photonic mode and said high frequency first photonic mode occurs in a direction perpendicular to said periodic structure.

38. The method of lasing of claim 37, further comprising the steps of:

(c) selecting one of said low frequency first photonic mode and said high frequency first photonic mode to selectively control said lasing wavelength by at least one (1) varying emission strength of said light beam,
(2) varying absorption of said periodic material, and
(3) varying a gain spectral distribution of said gain medium.

39. A method of lasing implemented in a periodic structure configured to produce a photonic stop band having a high frequency band edge comprising a first plurality of high frequency photonic modes of sequentially increasing frequencies and a low frequency band edge comprising a corresponding second plurality of low frequency photonic modes of sequentially decreasing frequencies, said periodic structure being doped with a gain medium distributed within said periodic structure in a plurality of equally spaced alternating regions of high and low gain medium concentration, the method comprising the step of:

(a) applying excitation to said periodic structure to cause said gain medium to emit electromagnetic radiation at a particular frequency mode, a number of said particular frequency mode corresponding to a number of high gain medium concentration regions within said periodic structure, such that lasing at a lasing wavelength corresponding to said particular frequency mode occurs in a direction perpendicular to said periodic structure.

40. The method of lasing of claim 39, wherein when said gain medium is of a first composition having a first gain spectral distribution, said particular frequency mode is located at said high frequency band edge, and wherein when said gain medium is of a second composition having a second gain spectral distribution, said particular frequency mode is located at said low frequency band edge.

41. The method of lasing of claim 39, wherein said periodic structure is composed from at least one material selected from a group consisting of: layered dielectric structure, cholesteric liquid crystal, conjugated polymer chiral material, artificially created chiral structure, naturally occurring chiral structure, a chiral substance configured to conduct electrons, and a chiral substance configured to conduct holes.

42. The method of lasing of claim 39, wherein said gain medium is composed from at least one material selected from a group consisting of: rare earth doped material, chelated rare earth doped material, semiconductor materials, organic light-emitting materials, conjugated polymers, dye-doped material, and materials containing color centers.

43. The method of lasing of claim 39, wherein when said gain medium is of a first composition having a first gain spectral distribution, said particular frequency mode is located at said high frequency band edge, and wherein when said gain medium is of a second composition having a second gain spectral distribution, said particular frequency mode is located at said low frequency band edge.

44. The method of lasing of claim 41, wherein said periodic structure is composed from at least one material selected from a group consisting of: conductive cholesteric liquid crystal, conductive conjugated polymer chiral material, artificially created conductive chiral structure, naturally occurring chiral structure, a chiral substance configured to conduct electrons, and a chiral substance configured to conduct holes.

45. A method of lasing implemented in a conductive periodic structure configured to produce a photonic stop band having a high frequency band edge comprising a first plurality of high frequency photonic modes of sequentially increasing frequencies and a low frequency band edge comprising a corresponding second plurality of low frequency photonic modes of sequentially decreasing frequencies, said periodic structure being doped with a uniformly distributed electrically excitable gain medium, the method comprising the step of:
(a) applying a spatially non-uniform electrical current to said periodic structure to produce a plurality of alternating high gain and low gain regions within said periodic structure and to cause said gain medium to emit electromagnetic radiation at a particular frequency mode, a number of said particular frequency mode corresponding to a number of high gain regions within said periodic structure, such that lasing at a lasing wavelength corresponding to said particular frequency mode occurs in a direction perpendicular to said periodic structure.

46. A method of lasing implemented in a periodic structure configured to produce a photonic stop band, having a high frequency band edge comprising a first plurality of high frequency photonic modes of sequentially increasing frequencies and a low frequency band edge comprising a corresponding second plurality of low frequency photonic modes of sequentially decreasing frequencies, said periodic structure being doped with a uniformly distributed gain medium and being configured as a vertical cavity liquid crystal laser, said method comprising the step of:
(a) applying a spatially and intensity non-uniform optical excitation to said periodic structure to produce a plurality of alternating high gain and low gain regions within said periodic structure and to cause said gain medium to emit electromagnetic radiation at a particular frequency mode, a number of said particular frequency mode corresponding to a number of high gain regions within said periodic structure, such that lasing at a lasing wavelength corresponding to said particular frequency mode occurs in a direction perpendicular to said periodic structure.

47. The method of lasing of claim 46, wherein said step (a) further comprises the steps of:
(b) providing a power source connected to a plurality of optical pumps; and
(c) positioning said plural optical pumps sequentially along said periodic structure, and (d) configuring said plural optical pumps to produce a plurality of alternating high gain and low gain regions within said periodic structure by providing pumping light beams of different characteristics.

48. The method of lasing of claim 47, wherein each said plural optical pump is a light-emitting diode.

49. The method of lasing of claim 47, wherein when said gain medium is of a first composition having a first gain spectral distribution, said particular frequency mode is located at said high frequency band edge, and wherein when said gain medium is of a second composition having a second gain spectral distribution, said particular frequency mode is located at said low frequency band edge.

50. The method of lasing of claim 47, wherein said periodic structure is composed from at least one material selected from a group consisting of: layered dielectric structure, cholesteric liquid crystal, conjugated polymer chiral material, artificially created chiral structure, naturally occurring chiral structure, a chiral substance configured to conduct electrons, and a chiral substance configured to conduct holes.

51. The method of lasing of claim 47, wherein said gain medium is composed from at least one material selected from a group consisting of rare earth doped material, chelated rare earth doped material, semiconductor materials, organic light-emitting materials, conjugated polymers, dye-doped material, and materials containing color centers.

52. The method of lasing of claim 46, wherein said step (a) further comprises the step of:
(e) controlling configuration of said plural optical pumps to dynamically produce a plurality of alternating high gain and low gain regions within said periodic structure by providing pumping light beams of different characteristics.

53. A method of lasing implemented in a periodic structure configured to produce a photonic stop band having a high frequency band edge comprising a first plurality of high frequency photonic modes of sequentially increasing frequencies and a low frequency band edge comprising a corresponding second plurality of low frequency photonic modes of sequentially decreasing frequencies, said periodic structure being doped with a gain medium, the method comprising the steps of:
(a) selecting a mode from one of said first plurality of high frequency photonic modes and second plurality of low frequency photonic modes by varying gain distribution within said periodic structure to produce a non-uniform gain distribution having at least one gain peak therein, and
(b) applying excitation to said periodic structure, to cause said gain medium to emit electromagnetic radiation at a particular frequency mode, a number of said particular frequency mode corresponding to a number of gain peaks within said periodic structure, such that lasing at a lasing wavelength corresponding to said particular frequency mode occurs in a direction perpendicular to said periodic structure.

* * * * *